United States Patent
Wong

Patent Number: 5,847,946
Date of Patent: Dec. 8, 1998

[54] VOLTAGE BOOSTER WITH PULSED INITIAL CHARGING AND DELAYED CAPACITIVE BOOST USING CHARGE-PUMPED DELAY LINE

[75] Inventor: Anthony Yap Wong, Cupertino, Calif.

[73] Assignee: Pericom Semiconductor Corp., San Jose, Calif.

[21] Appl. No.: 990,894

[22] Filed: Dec. 15, 1997

[51] Int. Cl.$^6$ .............................. H02M 3/18; H02K 5/13
[52] U.S. Cl. ............................................. 363/60; 327/108
[58] Field of Search ...................... 363/59, 60; 327/108, 327/157; 365/189.11, 230.06

[56] References Cited

U.S. PATENT DOCUMENTS

| | | | |
|---|---|---|---|
| 4,063,117 | 12/1977 | Laugesen et al. | 307/270 |
| 4,639,622 | 1/1987 | Goodwin et al. | 307/482 |
| 4,704,706 | 11/1987 | Nakano et al. | 365/203 |
| 4,967,399 | 10/1990 | Kuwabara et al. | 365/230.06 |
| 5,056,062 | 10/1991 | Kuwabara et al. | 365/189.11 |
| 5,134,317 | 7/1992 | Ohta | 307/482 |
| 5,144,156 | 9/1992 | Kawasaki | 307/262 |
| 5,164,889 | 11/1992 | Ruetz | 363/60 |
| 5,293,342 | 3/1994 | Casper et al. | 365/203 |
| 5,373,479 | 12/1994 | Noda | 365/230.06 |
| 5,576,647 | 11/1996 | Sutardja et al. | 327/108 |
| 5,642,313 | 6/1997 | Ferris | 365/185.25 |
| 5,646,898 | 7/1997 | Manning | 365/205 |
| 5,663,665 | 9/1997 | Wang et al. | 327/3 |
| 5,670,869 | 9/1997 | Weisenbach | 323/313 |
| 5,768,115 | 6/1998 | Pascucci et al. | 363/59 |
| 5,796,276 | 8/1998 | Phillips et al. | 327/108 |

*Primary Examiner*—Adolf Deneke Berhane
*Attorney, Agent, or Firm*—Stuart T. Auvinen

[57] ABSTRACT

A bus switch is constructed from an n-channel transistor. The gate terminal of the n-channel transistor is boosted above the power supply (Vcc) to increase current drive and reduce the channel resistance of the bus switch. The gate terminal is connected to a boosted node. When the bus switch is turned on, a pulse is generated to drive the boosted node from ground to Vcc. The boosted node is also an input of a delay line. After a delay through the delay line, the pulsed pull-up is turned off. Feeding the boosted node to the delay line allows the pulse to be self-timed. The delay line then drives the back-side of a capacitor from ground to Vcc. This voltage swing is coupled through the capacitor to the boosted node, driving the boosted node about 1.3 volts above Vcc. A small keeper transistor supplies a small current to the boosted node to counteract any leakage. This leaker transistor is connected to a charge pump, and the delay line that enables this keeper transistor is also connected to the charge pump. A precise sequence of events boosts the gate voltage of the bus switch above Vcc without drawing large currents from the charge pump.

20 Claims, 4 Drawing Sheets

VOLTAGE BOOSTER WITH PULSED INITIAL CHARGING AND DELAYED CAPACITIVE BOOST USING CHARGE-PUMPED DELAY LINE

FIELD OF THE INVENTION

This invention relates to CMOS integrated circuits, and more particularly to voltage booster circuits.

BACKGROUND OF THE INVENTION

Semiconductor bus switches are being used in high-speed network routing and switching applications. These bus switches are constructed from complementary metal-oxide-semiconductor (CMOS) transistors. Each transistor acts as a switch that connects or disconnects two network lines (media) from each other. The network lines are connected to the source and drain terminals while the transistor's gate terminal is connected to a control signal.

Smaller geometries and a desire to reduce power consumption and heat have caused the power-supply voltage to decrease from 5.0 volts to 3 or 3.3 volts on many integrated circuits (IC's). The lower 3-volt power supply has the disadvantage that a transistor bus switch has increased channel ("on") resistance when its gate is driven with 3 volts rather than 5 volts. The size (width) of the transistor can be increased to compensate somewhat for the reduced gate voltage, but this increases the area and parasitic capacitances that can slow down switching. When only an n-channel transistor is used, the transistor cannot pass full-rail signals, since its drain voltage is Vcc−Vtn, about 2.6 volts for a 3.3-volt Vcc. A p-channel transistor can be added in parallel with the n-channel transistor to transfer full-rail signals (a transmission gate), but capacitances and area are further increased.

Many systems use both 5-volt and 3-volt power supplies for different IC's. These mixed systems can output a 5-volt signal to a 3-volt bus switch. The 3-volt bus switch could potentially latch up if a p-channel transistor was used in the switch. Thus transmission gates are undesirable. Using only n-channel transistors for the bus switch is therefore desirable.

One solution is to boost the gate voltage to an n-channel transistor that acts as a bus switch. The gate voltage can be boosted above the 3-volt power supply by a voltage-booster circuit. For example, the gate voltage can be boosted to 4.3 volts using a capacitive pump. See for example, U.S. Pat. No. 4,639,622 by Goodwin et al., assigned to IBM; U.S. Pat. No. 4,063,117 by Lagesen et al., assigned to National Semiconductor Corp.; and U.S. Pat. No. 4,704,706 by Nakano et al., assigned to Fujitsu Ltd.

While these voltage-booster circuits are effective, a more efficient and precise voltage booster circuit is desirable. A voltage booster for an n-channel bus switch is desired.

SUMMARY OF THE INVENTION

A voltage booster circuit has an input, a boosted node, and a pulse generator that is coupled to the input. The pulse generator generates a pulse in response to a transition of the input. A pulsed pull-up is coupled to the boosted node. It pulls the boosted node to a power-supply voltage in response to the pulse.

A delay line that is coupled to the boosted node generates a delayed signal in response to the boosted node is pulled up to the power-supply voltage. A capacitor is coupled to the boosted node and is responsive to the delayed signal. It capacitivly couples a voltage swing into the boosted node in response to the delayed signal. The voltage swing boosts a voltage of the boosted node to a boosted voltage above the power-supply voltage.

Thus the boosted node is first pulsed to the power-supply voltage by the pulsed pull-up, and then the boosted node activates the delay line to the capacitor to boost the boosted voltage by capacitive coupling.

In further aspects of the invention a charge pump generates a pumped voltage above the power-supply voltage. The charge pump does not directly supply current to the boosted node to charge the boosted node.

In further aspects, a keeper pull-up is coupled to the boosted node and coupled to the charge pump. It supplies a small current to the boosted node. This small current is sufficient to offset leakage currents from the boosted node but is not sufficient to pull the boosted node up to the pumped voltage. The keeper pull-up is further coupled to the delayed signal from the delay line. The keeper pull-up is enabled by the delayed signal.

In still further aspects, the delay line is a pumped delay line coupled to the charge pump. The delay line outputs the pumped voltage rather than the power-supply voltage as a high voltage of the delayed signal. The delayed signal is also coupled to the pulsed pull-up. The pulsed pull-up is disabled from pulling up the boosted node in response to the delayed signal from the delay line. Thus the pulsed pull-up is self-timed.

In other aspects, the boosted node is coupled to a gate of a bus-switch transistor. The bus-switch transistor drives a greater current when the boosted node is at the boosted voltage than at the power-supply voltage. Thus channel resistance of the bus-switch transistor is decreased by the voltage booster circuit. The pumped voltage is about a transistor threshold voltage above the power-supply voltage.

DETAILED DESCRIPTION

The present invention relates to an improvement in voltage booster circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The gate node of a bus switch can be boosted by capacitivly coupling a voltage swing into the gate node. Using a capacitor to boost the gate voltage is preferable to using a charge pump because smaller charge pumps have a limited current drive. Larger charge pumps are expensive and should be avoided.

The voltage swing applied to the capacitor can be generated by a pulse generator or delay lines that are separate from the gate node. However, the inventor prefers to use the gate node itself to trigger the delay line and a sequence of events that ultimately boosts the gate node from ground to the power supply (Vcc) and then to the boosted voltage above Vcc. This sequence of events minimizes current drain and power requirements from the charge pump and guarantees that the boosted voltage is at a highest level.

Figure 1:
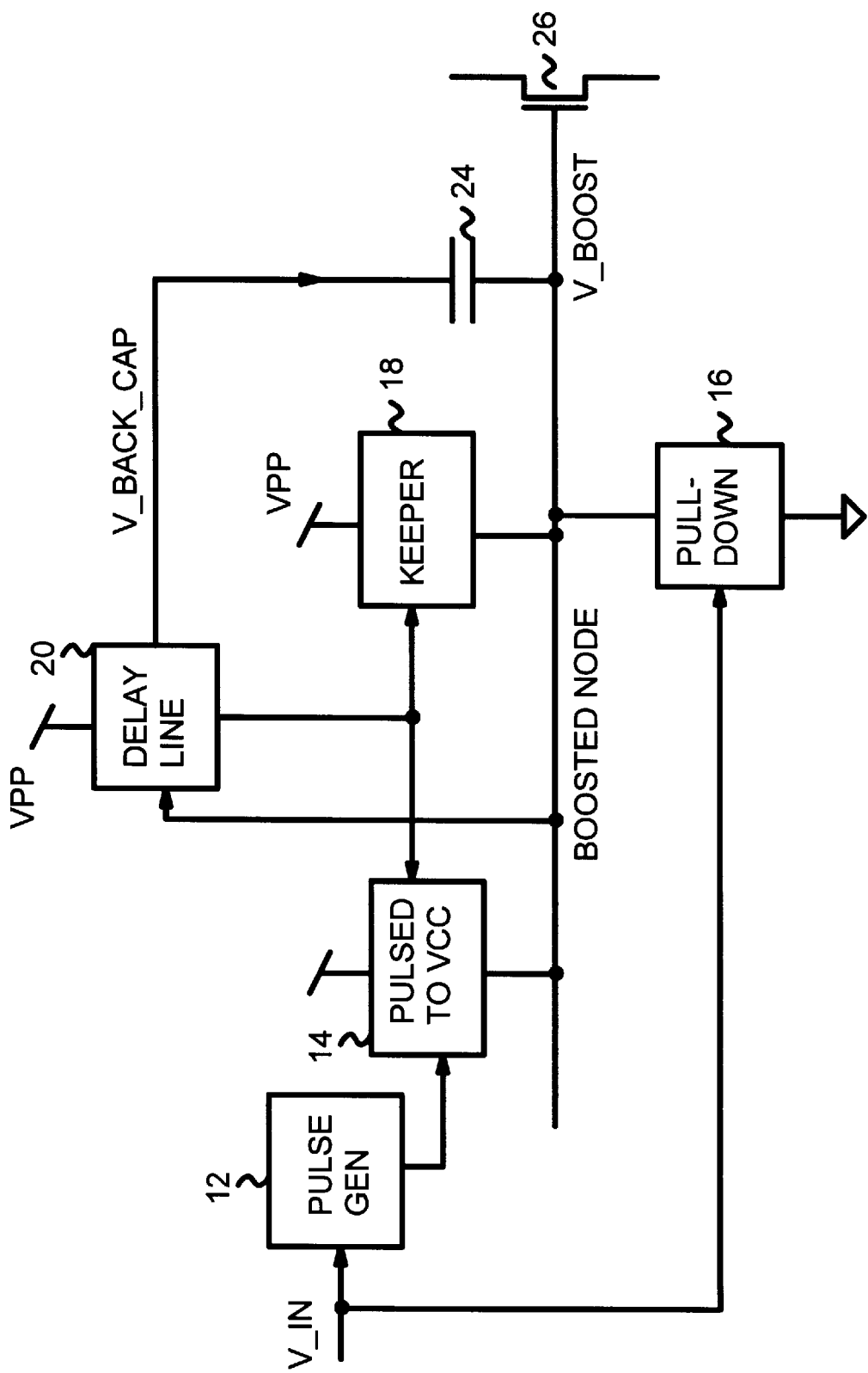
FIG. 1 is a simplified diagram of a voltage booster circuit.

FIG. 1 is a simplified diagram of a voltage booster circuit. A bus switch uses n-channel transistor 26 to selectively connect two network lines through the channel of transistor 26. The gate of transistor 26 is boosted in voltage to a voltage above Vcc when transistor 26 is turned on. The gate node of transistor 26 is thus the boosted node.

An input signal V_IN is high when transistor 26 is turned off, but low when transistor 26 is turned on. Thus the voltage booster circuit is inverting. When V_IN is high, pull-down 16 pulls the boosted node down to ground, turning off transistor 26.

To enable the bus-switch transistor 26, V_IN is pulled low. Pull-down 16 is disabled. Pulse generator 12 generates a pulse that pulses the boosted node to Vcc using pulsed pull-up 14. Bus-switch transistor 26 is turned on, but only weakly conducts since its gate is at Vcc rather than the boosted voltage.

The boosted node is input to delay line 20. When pulsed pull-up 14 drives the boosted node to Vcc, delay line 20 is activated. Delay line 20 then outputs a high voltage that activates keeper 18, which is a relatively small transistor that maintains a high voltage on the boosted node.

Delay line 20 also drives a power-supply voltage (Vcc) onto the back-side of capacitor 24, voltage V_BACK_CAP. The back-side of capacitor 24 was at ground, but is quickly driven high to Vcc by delay line 20. The front-side of capacitor 24 is the boosted node that was just driven to Vcc by pulsed pull-up 14. The 3-volt (ground to Vcc) swing on the back-side of capacitor 24 is coupled to the boosted node, raising its voltage above Vcc.

The voltage boost coupled through capacitor 24 is determined by the coupling ratio, a ratio of the capacitance of capacitor 24 to the total capacitance of the boosted node. The gate capacitance of transistor 26 is significant, while the input capacitance to delay line 20 and the drain capacitances of pull-down 16, pulsed pull-up 14, and keeper 18 are smaller. A coupling ratio of 0.3 to 0.5 can be achieved by making capacitor 24 large and minimizing other capacitances on the boosted node. Such a coupling ratio coupes 1 to 1.5 volts of the 3-volt swing into the boosted node. Thus the voltage V_BOOST on the gate of transistor 26 is boosted to about 4.0 to 4.5 volts.

Delay line 20 and keeper 18 are connected to a pumped power supply voltage (Vpp) rather than Vcc. This prevents current flow from the boosted node to Vcc when the boosted node is driven above Vcc.

A charge pump is used to generate Vpp, which is about a transistor threshold voltage above Vcc. Thus Vpp is about 4.3 volts. Keeper 18 thus keeps the voltage of the boosted node at Vpp rather than Vcc. Keeper 18 compensates for leakage from the boosted node, but is not large enough to drive the boosted node to Vpp in a reasonably short time. Keeper 18 thus does not draw too large of a current from the charge pump, allowing a small charge pump to be used.

Figure 2:
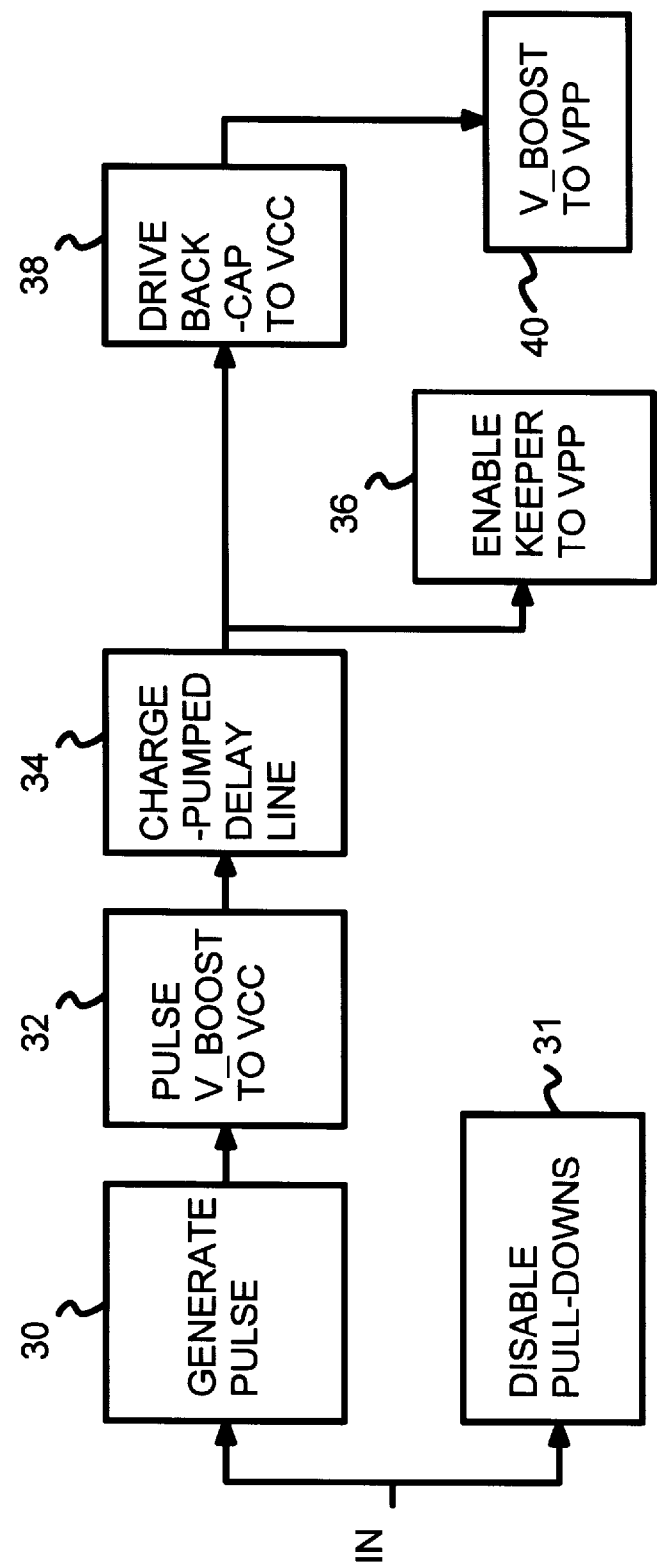
FIG. 2 is a diagram of the sequence of events when boosting the gate voltage above Vcc.

Sequence of Events During Boosting—FIG. 2

FIG. 2 is a diagram of the sequence of events when boosting the gate voltage above Vcc. The input signal disables the pull-down of the boosted node, step 31. A pulse is generated from the falling input, step 30. This pulse is used to boost the boosted node to the power supply Vcc, step 32.

After a delay through a charge-pumped delay line, step 34, the delay line drives the back-side of the capacitor from ground to Vcc, step 38. This voltage swing is capacitivly coupled through the capacitor to the boosted node, step 40. The voltage on the boosted node is boosted up to about Vpp, depending on the coupling ratio.

A small keeper pull-up is enabled, step 36. This keeper device is not large enough to pull the boosted node to the charge-pump voltage Vpp, but is large enough to compensate for small leakage currents from the boosted node.

This sequence of events first drives the boosted gate node to Vcc, and then after a delay the boosted node is driven to Vpp by capacitive coupling. Enabling and disabling of keeper and pull-down devices are precisely coordinated to maximize the voltage boost.

Figure 3:
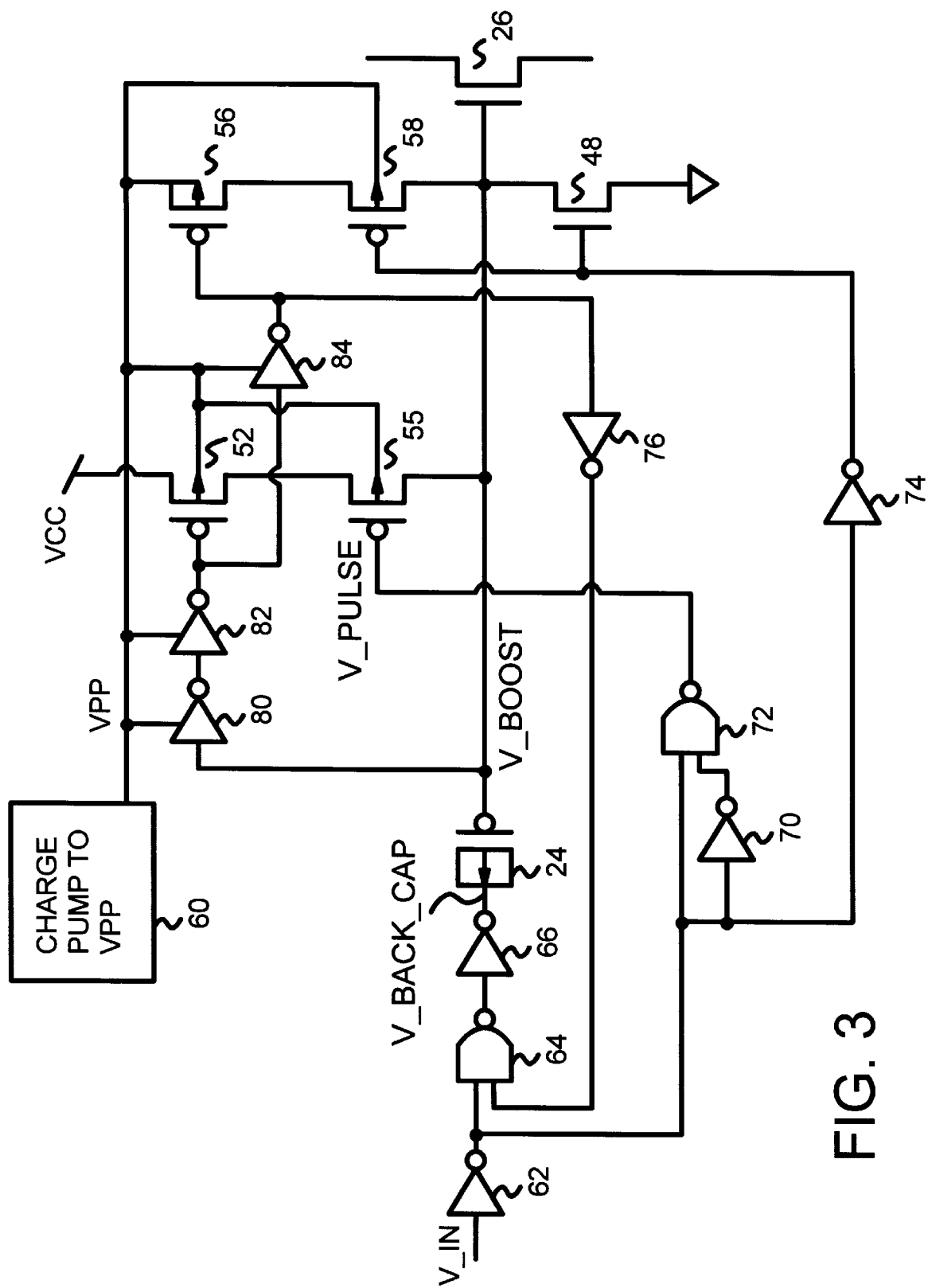
FIG. 3 is a schematic diagram of a voltage booster circuit.

Detailed Circuit—FIG. 3

FIG. 3 is a schematic diagram of a voltage booster circuit. When V_IN is high, the boosted node (V_BOOST) is grounded so bus-switch transistor 26 is turned off. The back-side node (V_BACK_CAP) is also grounded, so that both sides of capacitor 24 are grounded. Transistors 55, 56, and 58 are off, disabling all pull-up current paths. The boosted node is pulled down to ground by pull-down n-channel transistor 48 when V_IN is high.

Inverter 70 and NAND gate 72 form a pulse generator, with the pulse width determined by the delay through inverter70. P-channel transistors 52, 55 are a pulsed pull-up used to initially pulse the boosted node to Vcc.

Charge pump 60 drives the sources of p-channel pull-up transistors within inverters 80, 82, 84 in the delay line to Vpp. The delay line has its input connected to the boosted node. NAND gate 64 and inverters 66, 76 drive the back-side of capacitor 24 from ground to Vcc after the delay through the delay line. Inverters 76, 66, and NAND gate 64 are not connected to Vpp to reduce current drawn from Vpp.

P-channel transistors 56, 58 act as small keeper transistors to compensate for any leakage currents in the boosted node. The source and substrate terminals of p-channel keeper transistor 56 are connected to Vpp from charge pump 60. The N-well substrates of transistors 55, 58 are connected to Vpp so that the p+-to-substrate diodes at the sources of these transistors do not become forward biased and conduct current from the boosted node.

P-channel transistors turn on when their gates are at least a p-channel threshold below their sources. If Vpp is more than a threshold above Vcc, and is applied to the sources of transistors 52, 56, then these transistors could turn on when the gates are driven to Vcc when they should be off. Sub-threshold currents can also be a problem even if the gate-to-source voltage is somewhat less than a threshold. To avoid these problems, the gates of transistors 52, 56 are driven high to Vpp rather than to Vcc, so that the gate-to-source voltage is zero when the transistor is intended to be off. Inverters 80, 82, 84 in the delay line are thus connected to Vpp rather than Vcc so that they drive the gates of transistors 52, 56 high to Vpp. The substrates of transistors 52, 56 are also connected to Vpp.

Capacitor 24 is constructed from a p-channel transistor with its source, drain, and substrate (bulk) terminals connected together as the back-side node of capacitor 24, while the transistor's gate is the front-side node, the boosted node. Using the gate of capacitor 24 for the boosted node reduces leakage and parasitic capacitances. A p-channel transistor is used to construct capacitor 24 so that it can have its own N-well; n-channel transistors share a common p-type substrate.

Operation

When V_IN is asserted low to enable bus-switch transistor 26, a sequence of events is initiated as shown in FIG. 2. The low transition of V_IN is transmitted through inverters 62, 74 to disable pull-down n-channel transistor 48 and enable p-channel transistor 58. P-channel transistors 56, 58 are in series, but current does not yet flow since keeper p-channel transistor 56 is still off. The back-side of capacitor 24 remains at ground even when the upper input to NAND gate 64 transitions high, because inverter 76 still drives a low to the bottom input to NAND gate 64.

NAND gate 72 generates a low-going pulse that is terminated after the delay through inverter 70. This low-going pulse activates p-channel pulse transistor 55 for a short time. The boosted node is driven high to Vcc through the series connection of p-channel transistors 52, 55, which are both on. The low-going pulse from NAND gate 72 is long enough for p-channel pulse transistor 55 to pull the boosted node up to Vcc (3 volts).

Once the boosted node is pulled from ground up to Vcc by pulse transistors 52, 55, the delay line is activated. Inverter 80 has its input connected directly to the boosted node, and inverters 80, 82 delay the rising signal of the boosted node and then turn off pulse transistor 52. This allow the pulse to be self-timed. The delay through inverter 70 can be relatively large so that the pulse from NAND gate 72 is wide. The boosted node is then isolated from Vcc by pulse transistor 52 being turned off by the delay line. This self-timing can account for process and temperature variations.

Inverter 84 in the delay line then drives a low voltage to keeper p-channel transistor 56, which then supplies a very small current from Vpp to the boosted node through transistor 58, which is also on. The size of keeper p-channel transistors 56, 58 are small so that little current is drawn from charge pump 60. These transistors are not large enough to actively drive the boosted node to Vpp, which requires several milliamps of current. Instead, only a few microamps of current are supplied, reducing the drain on charge pump 60.

Inverter 76 then drives a high to the bottom input of NAND gate 64, and inverter 66 drives the back-side of capacitor high, from ground to Vcc. Inverter 66 can be made large and fast to quickly drive the back-side of capacitor 24. Part of this 3-volt swing is coupled to the front-side of capacitor 24, resulting in a boost in the voltage of the boosted node. The voltage is boosted from Vcc (3 volts) to about 4.3 volts (about the same as Vpp). This boosted voltage is applied to the gate of bus-switch transistor 26, increasing the gate-to-source voltage and thus increasing its current drive and reducing its channel resistance. A faster bus switch is thus achieved.

Figure 4:
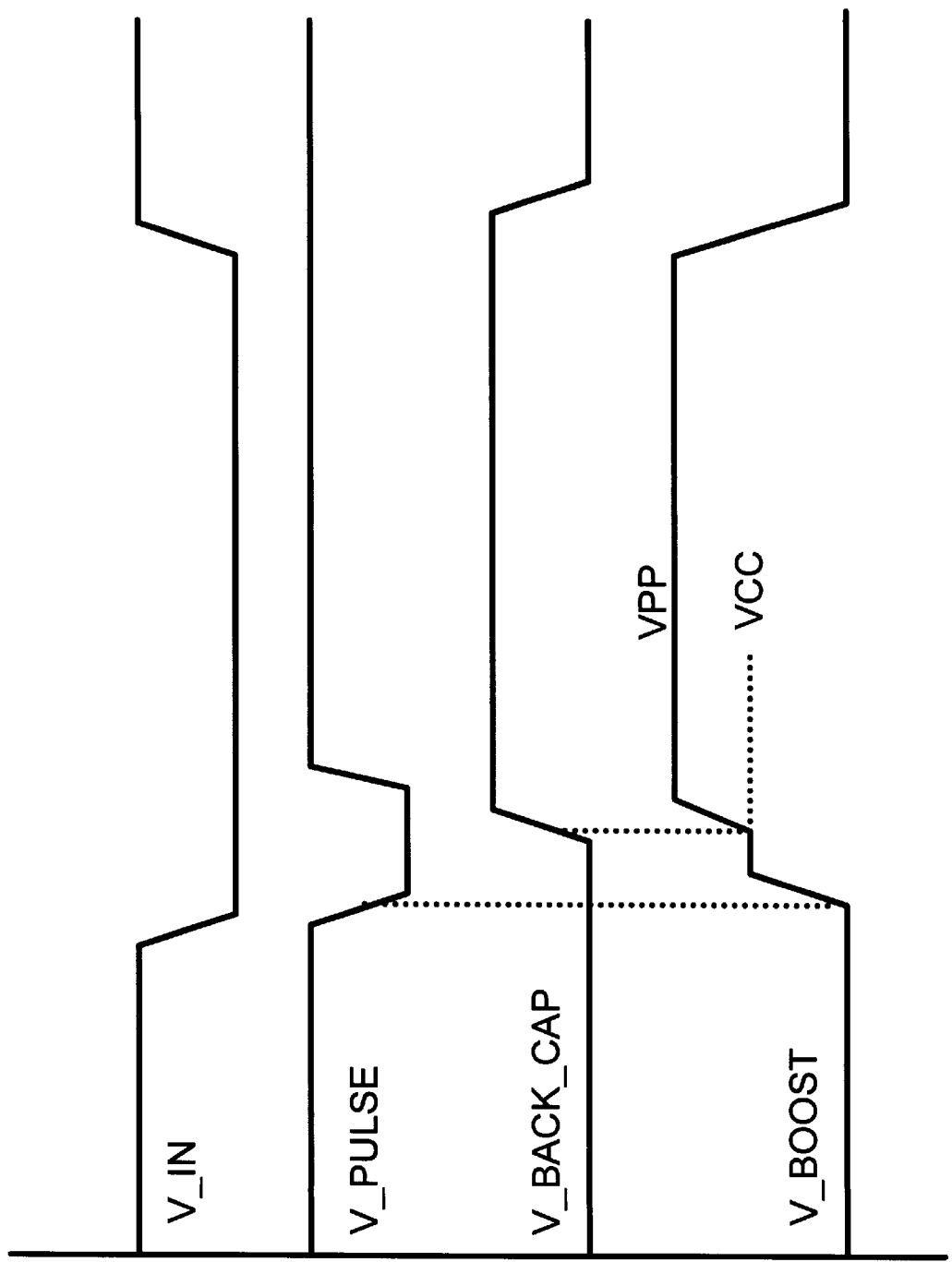
FIG. 4 is a waveform diagram of the operation of the voltage booster circuit.

Waveform—FIG. 4

FIG. 4 is a waveform diagram of the operation of the voltage booster circuit. When the input voltage V_IN is driven low to enable the bus switch, a pulse is generated. V_PULSE is a low-going pulse that enables a pull-up that drives the boosted node's voltage V_BOOST from ground to the power-supply voltage Vcc. The width of the pulse is sufficient to drive the boosted node all the way up to Vcc.

After a delay through the charge-pumped delay line, the back-side of the capacitor is driven from ground to Vcc. Only a fraction of the swing of V_BACK_CAP is coupled to the boosted node on the front-side of the capacitor, but this fraction is sufficient to boost voltage V_BOOST from Vcc to Vpp.

When input voltage V_IN is driven high to disable the bus switch, the boosted node is driven low by a pull-down transistor and the pull-ups are disabled. The back-side of the capacitor is also driven to ground to make it ready for a full swing up to Vcc the next time the bus switch is enabled.

ADVANTAGES OF THE INVENTION

The boosted node is actively driven to Vcc by a pull-up transistor, but indirectly boosted above Vcc by capacitive coupling. This is power-efficient since current from a charge pump is limited, while ample current is available from Vcc.

The pulse to Vcc can be self-timed. The delay through the pulse-generator's inverter can be relatively large so that the generated is wide. The boosted node is then isolated from Vcc by the upper pulse transistor being turned off by the delay line. This self-timing can account for process and temperature variations.

The connection of Vpp from the charge pump to the substrates of the p-channel transistors ensures that parasitic diodes remain reverse-biased. Driving the delay line with the charge-pumped Vpp allows the gate of a p-channel isolation transistor to be driven to Vpp, completely shutting off the transistor and thus isolating the boosted node.

ALTERNATE EMBODIMENTS

Several other embodiments are contemplated by the inventor. For example circuit devices can be substituted for the delay line, perhaps including resistive or capacitive delay elements. Transistor device sizes can be adjusted. N-channel transistors and p-channel transistors can be stacked respectively.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

APPENDIX—DEVICE SIZES

The following are the W/L transistor sizes in microns for FIG. 3. L is 0.5 micron unless otherwise indicated. Delay line inverters 80, 82, 84 use 1.0 micron L for both p and n. Gates 62, 64, 74, 72 use W=14 for both p and n. Capacitor 24 is a PMOS transistor with a W/L of 100/10, while inverters 70, 76 use 0.8/1.2 p and n transistors.

| Reference # | W | L |
|---|---|---|
| 52 | 210 | 0.5 |
| 55 | 210 | 0.5 |
| 56 | 4 | 0.5 |
| 58 | 4 | 0.5 |
| 48 | 56 | 0.5 |
| 26 | 7200 | 0.5 |

| Reference # | W(PMOS) | W(NMOS) |
|---|---|---|
| 80 | 8 | 2 |
| 82 | 8 | 2 |
| 84 | 2 | 2 |
| 66 | 42 | 42 |

I claim:

1. A voltage booster circuit comprising:
   an input;
   a boosted node;
   a pulse generator, coupled to the input, for generating a pulse in response to a transition of the input;

a pulsed pull-up, coupled to the boosted node, for pulling the boosted node to a power-supply voltage in response to the pulse;

a delay line, coupled to the boosted node, for generating a delayed signal in response to the boosted node being pulled up to the power-supply voltage; and a capacitor, coupled to the boosted node and responsive to the delayed signal, for capacitivly coupling a voltage swing into the boosted node in response to the delayed signal, the voltage swing boosting a voltage of the boosted node to a boosted voltage above the power-supply voltage, whereby the boosted node is first pulsed to the power-supply voltage by the pulsed pull-up, and then the boosted node activates the delay line to the capacitor to boost the boosted voltage by capacitive coupling.

2. The voltage booster circuit of claim 1 further comprising:

a charge pump for generating a pumped voltage above the power-supply voltage;

wherein the charge pump does not directly supply current to the boosted node to charge the boosted node.

3. The voltage booster circuit of claim 2 further comprising:

a keeper pull-up, coupled to the boosted node and coupled to the charge pump, for supplying a small current to the boosted node, the small current sufficient to offset leakage currents from the boosted node but not sufficient to pull the boosted node up to the pumped voltage.

4. The voltage booster circuit of claim 3 wherein the keeper pull-up is further coupled to the delayed signal from the delay line, the keeper pull-up being enabled by the delayed signal.

5. The voltage booster circuit of claim 2 wherein the delay line is a pumped delay line coupled to the charge pump, the delay line outputting the pumped voltage rather than the power-supply voltage as a high voltage of the delayed signal.

6. The voltage booster circuit of claim 5 wherein the delayed signal is also coupled to the pulsed pull-up, the pulsed pull-up being disabled from pulling up the boosted node in response to the delayed signal from the delay line, whereby the pulsed pull-up is self-timed.

7. The voltage booster circuit of claim 6 wherein the boosted node is coupled to a gate of a bus-switch transistor, the bus-switch transistor driving a greater current when the boosted node is at the boosted voltage than at the power-supply voltage, whereby channel resistance of the bus-switch transistor is decreased by the voltage booster circuit.

8. The voltage booster circuit of claim 6 wherein the pumped voltage is about a transistor threshold voltage above the power-supply voltage.

9. A voltage booster comprising:

a buffer for buffering an input to generate a buffered input;

a charge pump for generating a pumped voltage above a power-supply voltage;

a boosted node driven from ground to a boosted voltage above the power-supply voltage;

a pull-down n-channel transistor, coupled to drive the boosted node to ground in response to the buffered input;

a first pull-up p-channel transistor, having a gate controlled by the buffered input, for coupling the boosted node to a keeper node;

a keeper p-channel transistor, coupled to supply a keeper current to the keeper node from the charge pump, the keeper p-channel transistor having a gate coupled to a keeper-control node;

a pulse generator, responsive to the input, for generating a pulse in response to a first transition of the input but not generating the pulse in response to a second transition of the input;

a first p-channel transistor, having a drain coupled to the boosted node and a source coupled to a first node, for conducting current from the first node to the boosted node in response to the pulse applied to a gate of the first p-channel transistor;

a second p-channel transistor, having a drain coupled to the first node and a source coupled to the power-supply voltage, for conducting current from the power-supply voltage to the first node, the second p-channel transistor having a gate controlled by a delayed node; and a delay line of inverters, having a first inverter with an input connected to the boosted node, for delaying a rising transition of the boosted node to drive the delayed node to the second p-channel transistor;

a capacitor, driven by the delay line and coupled to the boosted node, for coupling a voltage wing output from the delay line to the boosted node;

wherein the delay line from the boosted node disables the second p-channel transistor after the boosted node has been charged to the power-supply voltage;

wherein the capacitor is pumped after the delay line delays the rising transition of the boosted node, whereby voltage booster is self-timed by the boosted node being fed back to the delay line.

10. The voltage booster of claim 9 wherein the delay line includes a second inverter for generating the keeper-control node from the delayed node.

11. The voltage booster of claim 10 wherein a substrate terminal of the keeper p-channel transistor is connected to the pumped voltage from the charge pump and wherein the second inverter is coupled to the pumped voltage and not coupled to the power-supply voltage.

12. The voltage booster of claim 11 wherein only a leakage current is drawn from the charge pump by the voltage booster, the leakage current being a few microamps, whereas a charging current through the first and second p-channel transistors is a current of several milliamps.

13. The voltage booster of claim 12 wherein the capacitor is a p-channel transistor with a gate connected to the boosted node and a source and a drain connected together to a back-side node.

14. The voltage booster of claim 13 wherein the capacitor is the p-channel transistor further having a substrate terminal connected to the backside node, the capacitor formed in an N-well.

15. The voltage booster of claim 14 wherein the back-side node of the capacitor is driven by a third inverter that is driven by a NAND gate, the NAND gate having a first input connected to the input and a second input connected to the delay line.

16. The voltage booster of claim 15 wherein the boosted node is coupled to a gate of a bus-switch transistor, the bus-switch transistor having a lower on-resistance when the boosted node is at the boosted voltage than at the power-supply voltage, whereby channel resistance of the bus-switch transistor is decreased by the voltage booster circuit.

17. The voltage booster of claim 16 wherein all inverters in the delay line are connected to the pumped voltage from the charge pump and not connected to the power-supply voltage, whereby the delay line is a pumped delay line that outputs the pumped voltage rather than the power-supply voltage.

18. The voltage booster of claim 17 wherein the pumped voltage is about a transistor threshold voltage above the power-supply voltage.

19. The voltage booster of claim 17 wherein the power-supply voltage is 3 volts and wherein the boosted voltage is about 4.3 volts.

20. The voltage booster of claim 16 wherein the keeper p-channel transistor has a substrate terminal connected to the pumped voltage from the charge pump.

* * * * *